(12) United States Patent
Kang

(10) Patent No.: US 9,721,914 B2
(45) Date of Patent: Aug. 1, 2017

(54) DISPLAY DEVICE AND ARRAY SUBSTRATE FOR DISPLAY DEVICE

(71) Applicant: LG DISPLAY CO., LTD., Seoul (KR)

(72) Inventor: Yeonwook Kang, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/968,534

(22) Filed: Dec. 14, 2015

(65) Prior Publication Data
US 2016/0190081 A1 Jun. 30, 2016

(30) Foreign Application Priority Data
Dec. 24, 2014 (KR) ........................ 10-2014-0188871

(51) Int. Cl.
*H01L 23/48* (2006.01)
*H01L 23/00* (2006.01)
*G02F 1/1345* (2006.01)

(52) U.S. Cl.
CPC .......... *H01L 24/13* (2013.01); *G02F 1/13458* (2013.01); *H01L 24/05* (2013.01); *H01L 24/11* (2013.01); *H01L 2224/0401* (2013.01); *H01L 2224/13* (2013.01); *H01L 2224/13019* (2013.01); *H01L 2224/13083* (2013.01); *H01L 2924/381* (2013.01)

(58) Field of Classification Search
USPC .......................................... 257/737
See application file for complete search history.

(56) References Cited

U.S. PATENT DOCUMENTS 7,355,280 B2 * 4/2008 Matsushima ........... H01L 24/11
257/737
2003/0062623 A1 * 4/2003 Ono ........................ H01L 24/10
257/737

FOREIGN PATENT DOCUMENTS

JP 11-31698 A 2/1999

* cited by examiner

*Primary Examiner* — Timor Karimy
(74) *Attorney, Agent, or Firm* — Birch, Stewart, Kolasch & Birch, LLP

(57) ABSTRACT

An array substrate for a display device can include a substrate, a pad positioned on the substrate, an insulating layer positioned on the pad and including a plurality of open portions exposing the pad, a first metal layer positioned on the insulating layer and disposed to be in contact with the pad, a second metal layer positioned on the first metal layer, and a bump electrode positioned on the second metal layer and including a plurality of dimples.

10 Claims, 11 Drawing Sheets

DISPLAY DEVICE AND ARRAY SUBSTRATE FOR DISPLAY DEVICE

This application claims the priority benefit of Korean Patent Application No. 10-2014-0188871 filed on Dec. 24, 2014, which is incorporated herein by reference for all purposes as if fully set forth herein.

BACKGROUND OF THE INVENTION

Field of the Disclosure

The present invention relates to a display device and an array substrate for a display device and, more particularly, to a display device and an array substrate for a display device in which a contact defect between a bump and a driving chip is prevented.

Related Art

In general, a liquid crystal display (LCD) device is driven using optical anisotropy and polarization qualities of liquid crystal. The liquid crystal is thin and long in structure, having orientation in molecular alignment, and the orientation of molecular alignment of liquid crystals may be controlled by intentionally applying an electric field to the liquid crystal. Thus, if the orientation of molecular alignment of liquid crystal is arbitrarily adjusted, the molecular alignment of liquid crystal becomes varied such that light is refracted in a direction toward the molecular alignment of liquid crystal due to optical anisotropy, thereby expressing image information.

The LCD device, having an active matrix structure in which thin film transistors (TFTs) and pixel electrodes connected to the TFTs are arranged in a matrix form to obtain excellent resolution and video implementation capability, has come to prominence. The above-mentioned LCD device includes a color filter substrate on which a common electrode is formed, an array substrate on which a pixel electrode is formed, and liquid crystal interposed between the two substrates. In the LCD device, an electric field applied between the common electrode and the pixel electrode drives liquid crystal, exhibiting excellent characteristics in terms of transmission ratio and an aperture ratio.

FIG. 1 is a plan view illustrating a related art array substrate for a display device, FIG. 2 is a cross-sectional view illustrating a bump, FIG. 3 is a plan view illustrating the bump, FIG. 4 is a scanning electron microscope (SEM) image of the bump, FIG. 5 is an image of a driving chip bonded to the bump, FIG. 6 is an image of an indentation of the bump and the driving chip, and FIG. 7 is an image illustrating a defective display device.

Now Referring to FIG. 1, a related art array substrate 10 for a display device includes a display area 11 which is an active area (A/A) for displaying an image and a non-display area 12. A chip on glass (COG) unit 13, to which a driving chip (D-IC) for applying a driving signal is bonded, is positioned in the non-display area 12, and a flexible printed circuit (FPC) pad unit 14, to which an FPC for applying an external driving signal to the driving chip is attached, is positioned in the non-display area 12. A plurality of bumps 20 connected to the driving chip are provided in the COG unit 13.

Referring to FIG. 2, the bumps 20 positioned in the COG unit 13 include a pad 22 positioned on a substrate 21 and a bump electrode 27 connected to the pad 22. In detail, the pad 22 is positioned on the substrate 21, and an insulating layer 23 including an open portion 24 exposing the pad 22 is positioned. A first metal layer 25 and a second metal layer 26 are positioned on the pad 22 exposed by the open portion 24 of the insulating layer 23. The first metal layer 25 is made of a titanium alloy, and the second metal layer 26 is made of gold (Au) to improve adhesion with the pad 22. The bump electrode 27 is disposed on the second metal layer 26 to be electrically connected to the pad 22.

Referring to FIGS. 3 and 4 together, the bump 20 configured as described above has a dimple 28 in the bump electrode 27 due to a difference between a thickness of the insulating layer 23 and a height of the open portion 24. The dimple 28 of the bump electrode 27 is formed to correspond to the difference between the thickness of the insulating layer 23 and the height of the open portion 24, and a planar area of the dimple 28 is formed to correspond to an area of the open portion 24.

Referring to FIGS. 5 and 6, when a driving chip is bonded to the COG unit including the bump with the dimple formed thereon through an anisotropic conductive film (ACF), conductive balls of the ACF cannot be firmly attached to the bump with the dimple formed thereon. As a result, as illustrated in FIG. 6, an indentation defect of the bump is observed in a rear surface of the substrate, and thus, the bump and the driving chip are determined as having defective contact. When the bump and the driving are defective in contact, a display defect appears as illustrated in FIG. 7. The display defect of a display device degrades productivity.

SUMMARY OF THE INVENTION

An object of the present invention is to provide an array substrate for a display device capable of preventing defective contact between a bump and a driving chip, and a display device.

To achieve these and other advantages and in accordance with the purpose of the present invention, as embodied and broadly described, an array substrate for a display device, includes a substrate, a pad positioned on the substrate, an insulating layer positioned on the pad and including a plurality of open portions exposing the pad, a first metal layer positioned on the insulating layer and disposed to be in contact with the pad, a second metal layer positioned on the first metal layer, and a bump electrode positioned on the second metal layer and including a plurality of dimples.

At least one of the plurality of open portions can have a width equal to or greater than 5 μm and a length equal to or greater than 10 μm.

A pitch between the plurality of open portions can be equal to or greater than 4 μm.

A bonding area in which the insulating layer and the bump electrode are in contact is equal to or greater than 1500 μm$^2$, and an area of the plurality of open portions is equal to or greater than 15% of the bonding area.

The plurality of open portions are formed as a plurality of lines or a plurality of dots.

In one aspect, a display device includes a substrate including a display area displaying an image and a non-display area, and a chip on glass (COG) unit positioned in the non-display area and including a plurality of bumps, wherein each of the plurality of bumps comprises, a pad positioned on the substrate, an insulating layer positioned on the pad and including a plurality of open portions exposing the pad, a first metal layer positioned on the insulating layer and disposed to be in contact with the pad, a second metal layer positioned on the first metal layer, and a bump electrode positioned on the second metal layer and including a plurality of dimples.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Hereinafter, embodiments of the present invention will be described in detail with reference to the accompanying drawings.

Figure 1:
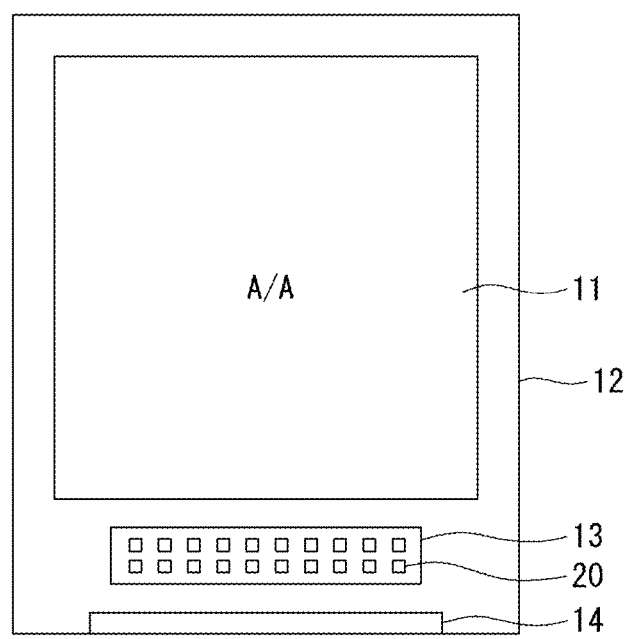
FIG. 1 is a plan view illustrating a related art array substrate for a display device.
Figure 2:
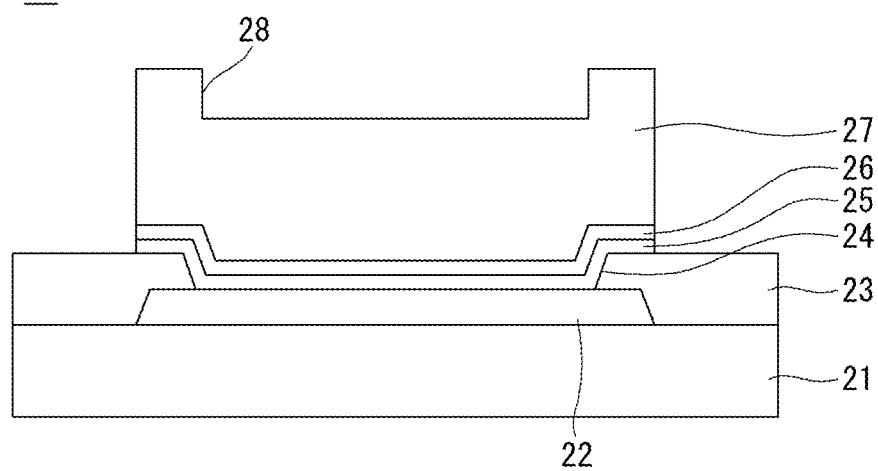
FIG. 2 is a cross-sectional view illustrating a bump according to a related art.
Figure 3:
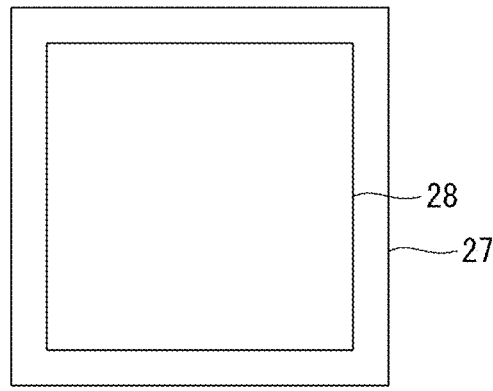
FIG. 3 is a plan view illustrating the bump.
Figure 4:
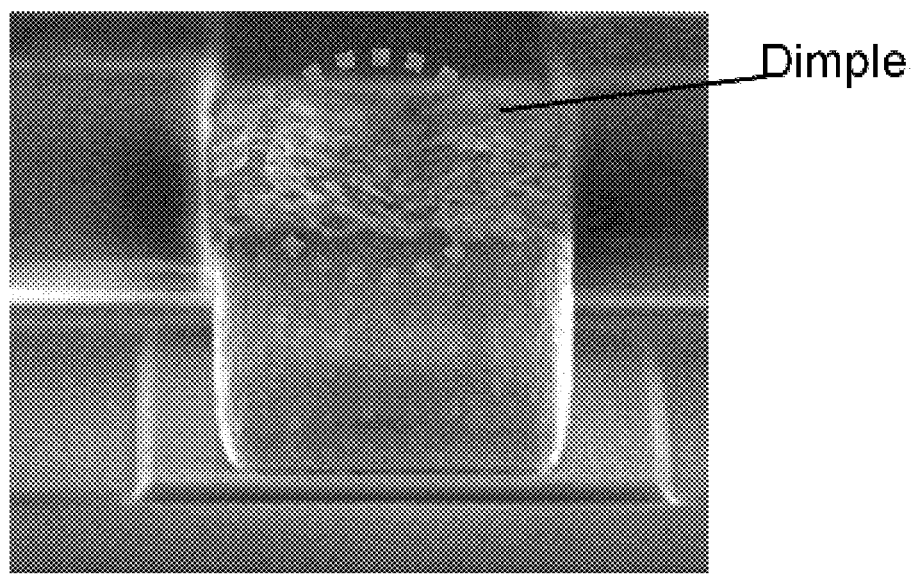
FIG. 4 is a scanning electron microscope (SEM) image of the bump of FIG. 2.
Figure 5:
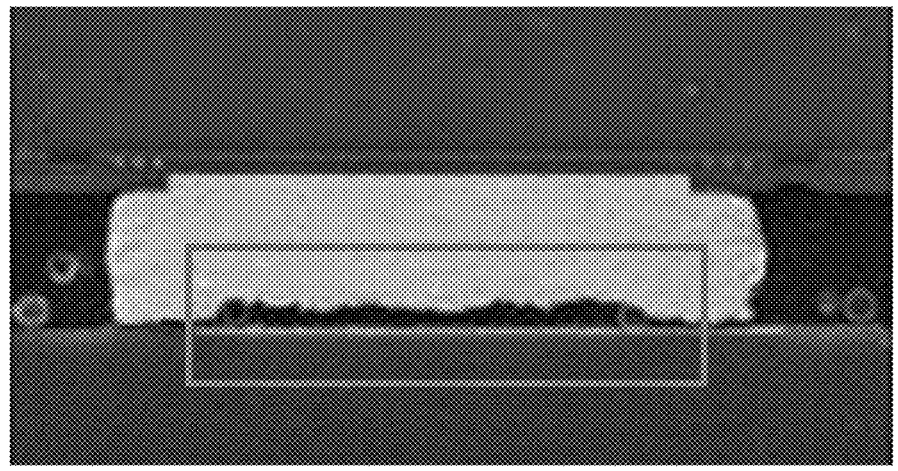
FIG. 5 is an image of a bump with a driving chip bonded thereto according to a related art.
Figure 6:
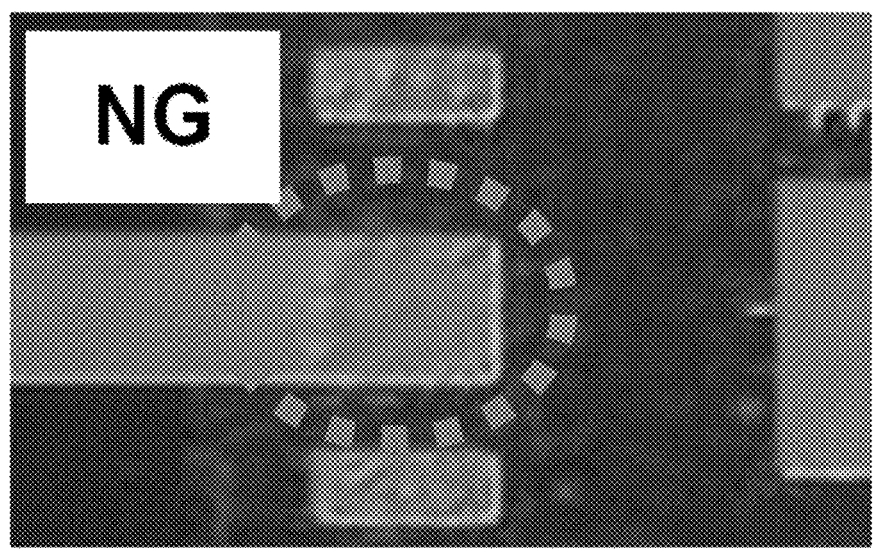
FIG. 6 is an image of an indentation of the bump and the driving chip of FIG. 5.
Figure 7:
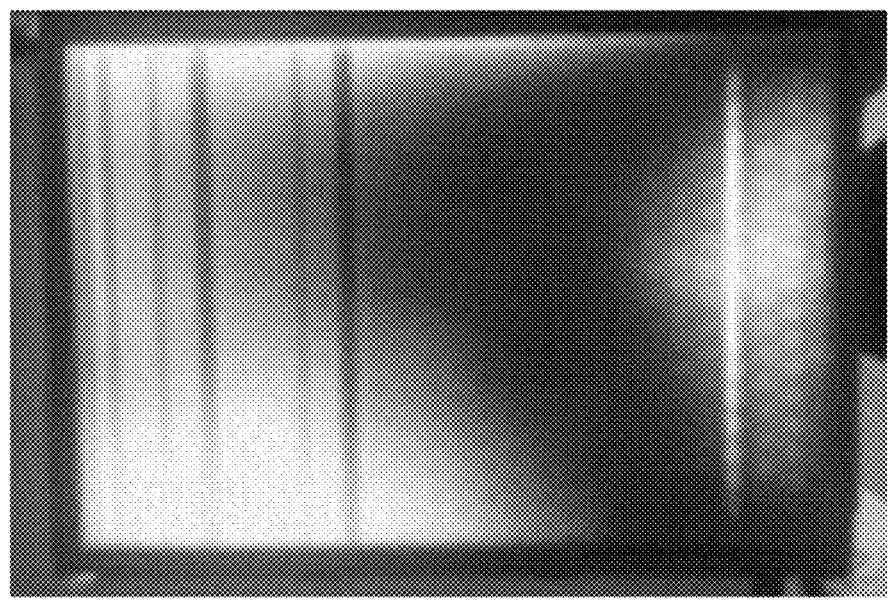
FIG. 7 is an image illustrating a defective display device according to a related art.
Figure 8:
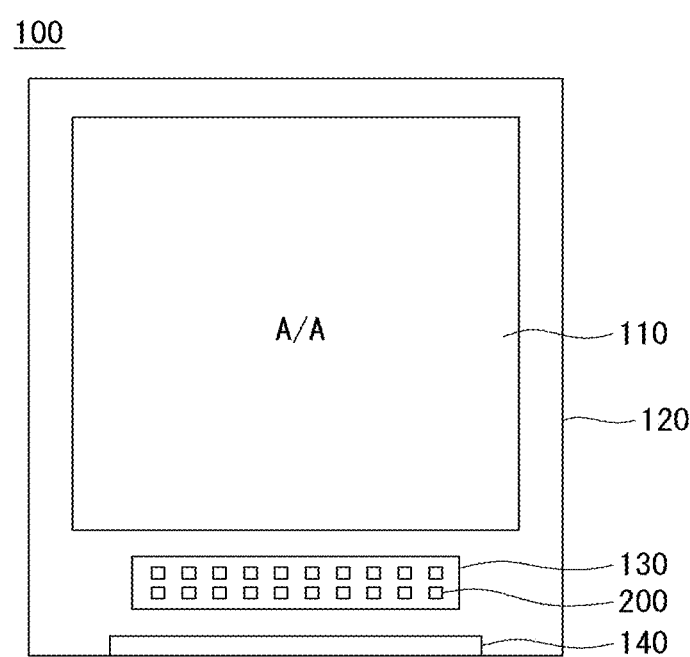
FIG. 8 is a plan view illustrating an array substrate for a display device according to an embodiment of the present invention.
Figure 9:
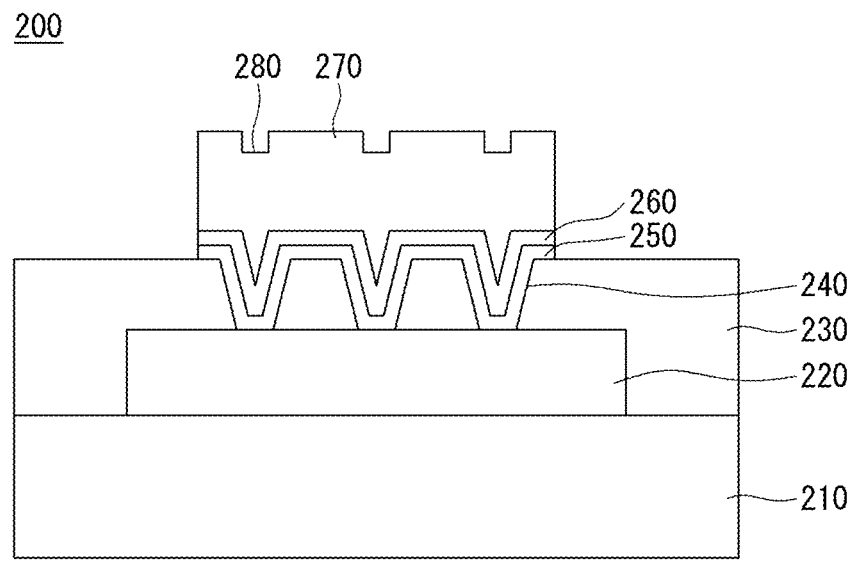
FIG. 9 is a cross-sectional view illustrating a bump according to an embodiment of the present invention.
Figure 10:
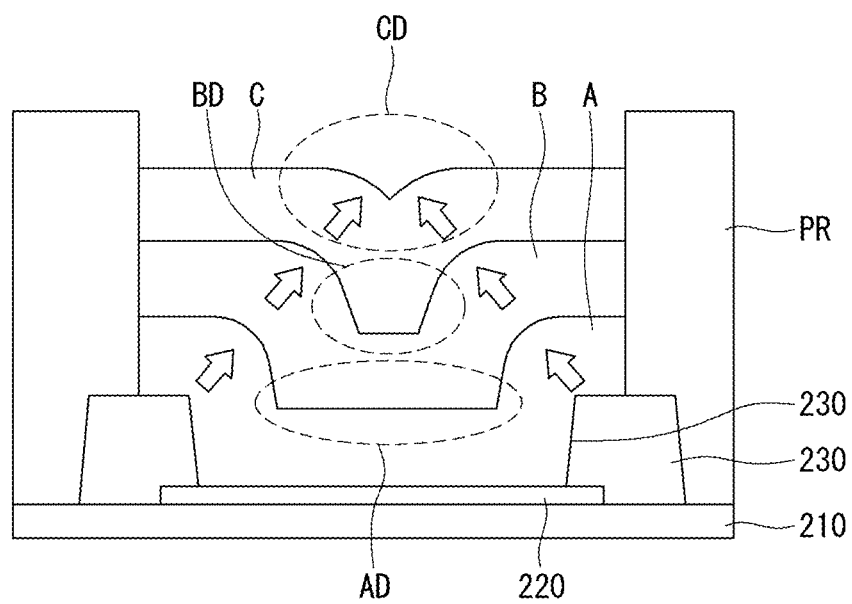
FIG. 10 is a schematic view of the bump according to an embodiment of the present invention.
Figure 11:
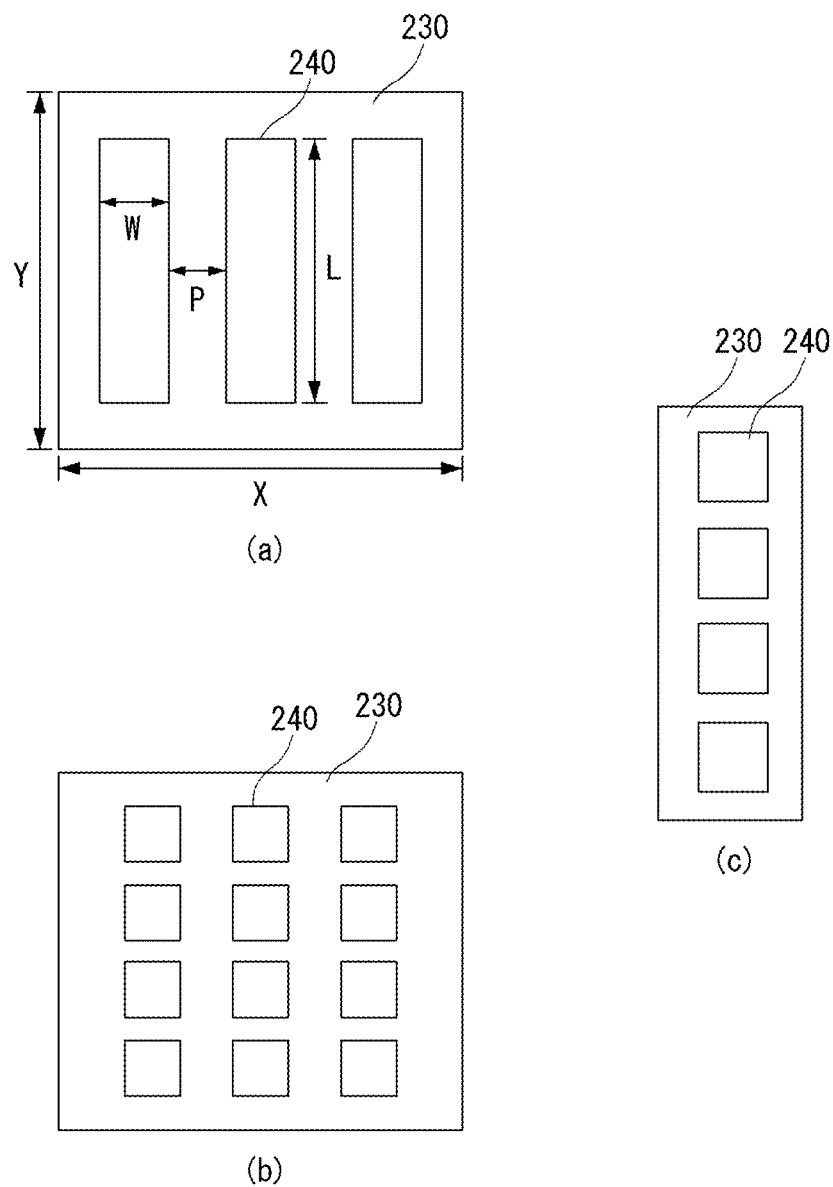
FIG. 11 is a plan view illustrating an open portion of an insulating layer provided in the bump according to an embodiment of the present invention.

FIG. 8 is a plan view illustrating an array substrate for a display device according to an embodiment of the present invention, FIG. 9 is a cross-sectional view illustrating a bump according to an embodiment of the present invention, FIG. 10 is a schematic view of the bump according to an embodiment of the present invention, and FIG. 11 is a plan view illustrating an open portion of an insulating layer provided in the bump according to an embodiment of the present invention. Hereinafter, a liquid crystal display (LCD) device will be illustrated and described as an example of a display device, but the present invention is not limited thereto and may also be applied to any other flat panel display device such as an organic light emitting display device or an electrophoretic display device.

Referring to FIG. 8, an array substrate 100 for a display device according to an embodiment of the present invention includes a display area 110 and a non-display area 120. The display area 110 is an active area (A/A) in which a liquid crystal layer is formed between a thin film transistor (TFT) array substrate and a color filter substrate to display an image.

A black matrix and color filters are provided on the color filter substrate of the display area 110. Data lines and gate lines (or scan lines) are formed to intersect with each other on the TFT array substrate, and pixels are disposed in a matrix form in cell areas defined by the data lines and the gate lines. Each of the pixels of the display area 110 is connected to a TFT and driven by an electric field between a pixel electrode and a common electrode. In a vertical field driving mode such as a twisted nematic (TN) mode and a vertical alignment (VA) mode, the common electrode is formed on a color filter substrate, and in an in-plane field driving mode such as an in-plane switching (IPS) mode or a fringe field switching (FFS) mode, the common electrode is formed together with a pixel electrode on a TFT substrate. A liquid crystal mode of the display area 110 may be implemented as any other mode, as well as as the TN mode, the VA mode, the IPS mode, and the FFS mode described above.

As the display area 110, typically, a transmissive liquid crystal display panel modulating light from a backlight unit may be selected. The backlight unit includes a light source turned on according to a driving current supplied from a backlight unit driving unit, a light guide plate (or a diffusion plate), and a plurality of optical sheets. The backlight unit may be divided into a direct type backlight unit or an edge type backlight unit. Light sources of the backlight unit may include any one or two or more light sources among a hot cathode fluorescent lamp (HCFL), a cold cathode fluorescent lamp (CCFL), an external electrode fluorescent lamp (EEFL), and a light emitting diode (LED).

In the non-display area 120, a chip on glass (COG) unit 130 to which a driving chip (D-IC) for applying a driving signal to the display area 110 is bonded, and a flexible printed circuit (FPC) pad unit 140, to which an FPC for applying an external driving signal to the COG unit 130 is attached, are positioned. The COG unit 130 includes bumps connected to data signal lines extending from the display area 110 and bumps connected to external signal lines extending from the FPC pad unit 140. These bumps 200 are bonded to the driving chip, and a data signal applied to the data signal lines through an external signal is adjusted by the driving chip.

Hereinafter, a structure of the foregoing bump will be described.

Referring to FIG. 9, the bump 200 according to an embodiment of the present invention includes a pad 220 and a bump electrode 270 electrically connected to the pad 220. In detail, the pad 220 is positioned on a substrate 210. The pad 220, connected to data signal lines extending from the display area or connected to external signal lines extending from the FPC pad unit, is composed of a low resistive metal such as aluminum (Al). An insulating layer 230 having an open portion 240 exposing a portion of the pad 220 is positioned on the pad 220. The insulating layer 230 insulates adjacent neighbor pads 220 and includes a silicon oxide (SiOx) or a silicon nitride (SiNx), or multiple layers thereof. Also, the insulating layer 230 may also include an organic substrate such as polyimide or an acrylic resin.

A first metal layer 250 is positioned on the pad 220 exposed by the open portion 240 of the insulating layer 230. The first metal layer 250 is in contact with the pad 220, is formed across a surface of the insulating layer 230, and serves to increase adhesion between the pad 220 and a second metal layer 260 to be formed later. The first metal layer 250 includes titanium (Ti), tungsten (W), palladium (Pd), or alloys thereof and may have a thickness ranging from 1 to 1000 nm. A second metal layer 260 is positioned on the first metal layer 250. The second metal layer 260 has the same size as that of the first metal layer 250, and overlaps the first metal layer 250. The second metal layer 260 serves to enhance adhesion with the bump electrode to be formed later and is formed of the same metal as that of the bump electrode. For example, the second metal layer 260 is composed of gold (Au). The second metal layer 260 has a thickness ranging from 1 to 1000 nm, the same as that of the first metal layer 250.

The bump electrode 270 is positioned on the second metal layer 260. The bump electrode 270 is electrically connected to the pad 220 through the first metal layer 250 and the second metal layer 260, and substantially in contact with the driving chip. The bump electrode 270 has the same size as those of the first metal layer 250 and the second metal layer 260, and is composed of a low resistive metal, e.g., gold (Au), or the like. The bump electrode 270 is formed by electroplating and has a thickness ranging from 1 to 1000 nm.

The bump 200 includes a plurality of open portions 240 in the insulating layer 230, and a plurality of dimples 280 in the bump electrode 270. A related art bump has a single open portion in the insulating layer, and thus, a dimple having a large area is formed according to a difference between a thickness of the insulating layer and a depth of the open portion. Thus, a contact defect occurs as conductive balls of an ACF are not in contact with the bump electrode due to the dimple of the bump electrode during a compressing process. Thus, the inventors of the present application suggest forming a plurality of open portions 240 in the insulating layer 230 in order to reduce a level of the dimple, i.e., a size of the dimple, of the bump electrode.

A principle of reducing a size of the dimple of the bump electrode will be described with reference to FIG. 10. The insulating layer 230 with the open portion 240 is positioned on the pad 220, and a photoresist pattern PR surrounding the insulating layer 230 is formed. When a plurality of first, second, and third layers are formed on the insulating layer 230, a dimple AD of the first layer (A) formed first is formed to be deep by a difference between a thickness of the insulating layer 230 and a height of the open portion 240, but a size thereof is reduced to a degree. The second layer (B) formed on the first layer (A) has a dimple BD which is thinner in depth and smaller in size than the dimple AD of the first layer (A). The third layer (C) formed on the second layer (B) has a dimple CD which is even thinner in depth and smaller in size than the dimple BD of the second layer (B). Each of the depth and size of the dimple is reduced as a width of the open portion 240 becomes smaller. That is, when the width and the size of the open portion 240 of the insulating layer 230 are reduced, the size and depth of the dimple 280 of the bump electrode 270 are also reduced.

Thus, in the present embodiment, a plurality of open portions 240 are provided in the insulating layer 230. Hereinafter, a shape of the open portions 240 formed in the insulating layer 230 will be described with reference to FIG. 11.

Referring to (a) of FIG. 11, a plurality of open portions 240 are provided in the insulating layer 230. An area defined by a width (X) and a length (Y) of the insulating layer 230 corresponds to a bonding area in which the bump electrode is in contact with the insulating layer 230 on the insulating layer 230. The bonding area in which the insulating layer 230 and the bump electrode are bonded, that is, the bonding area defined by the width (X) and the length (Y) is equal to or greater than 1500 μm² to secure minimum bonding reliability of the insulating layer 230 and the bump electrode. At least two open portions 240 are provided, and a width (W), a length (L), and a pitch (P) of these open portions 240 satisfy predetermined conditions. In detail, the width (W) of the open portion 240 is equal to or greater than 5 μm, the length (L) is equal to or greater than 10 μm, and the pitch (P) is equal to or greater than 4 μm. Also, the area ((A×C)×3) may be equal to or greater than 15% of the bonding area (X×Y). Such width (W), length (L), pitch (P), and area of the open portions 240 are conditions under which pad resistance between the bump electrode and the pad is maintained without being increased. Also, under the conditions of the width (W), the length (L), the pitch (P), and the area of the open portions 240, shear strength equal to or greater than 7.8 mgf/μm² is maintained such that the insulating layer 230 may not be damaged when the driving chip is bonded.

Referring to (b) of FIG. 11, dot-shaped open portions 240 may be provided, and referring to (c) of FIG. 11, dot-shaped open portions 240 may be linearly provided in a linear bonding area. In the present embodiment, the shapes of the open portions illustrated in (a) to (c) of FIG. 11 are described, but the present invention is not limited thereto and the open portions may have any shape as long as the open portions satisfy the aforementioned conditions.

As described above, in the bump provided in the array substrate for a display device, since the plurality of open portions are provided in the insulating layer, a dimple of the bump electrode is reduced and bonding reliability with respect to the driving chip is enhanced, improving a display defect.

Hereinafter, a method for manufacturing a bump according to an embodiment of the present invention will be described. FIGS. 12A through 12H are cross-sectional views illustrating a sequential process of a method for manufacturing a bump according to an embodiment of the present invention. In the following descriptions, the same reference numerals will be used for the same components as those of the bump of FIG. 9 to facilitate understanding.

Figure 12A:
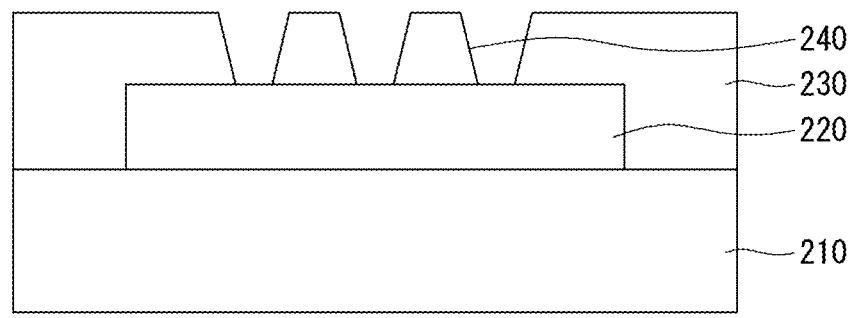
FIGS. 12A through 12H are cross-sectional views illustrating a sequential process of a method for manufacturing a bump according to an embodiment of the present invention.

Referring to FIG. 12A, a low resistive metal such as aluminum (Al) is deposited on a substrate 210 through sputtering, and patterning to form a pad 220. A silicon oxide (SiOx) or a silicon nitride (SiNx) is deposited on the substrate 210 with the pad 220 formed thereon through chemical vapor deposition (CVD) or plasma enhanced chemical vapor deposition (PECVD). A plurality of open portions 240 exposing portions of the pad 220 are formed using a photolithography method. Details of the size and area of the open portions 240 have been described, so descriptions thereof will be omitted.

Figure 12B:
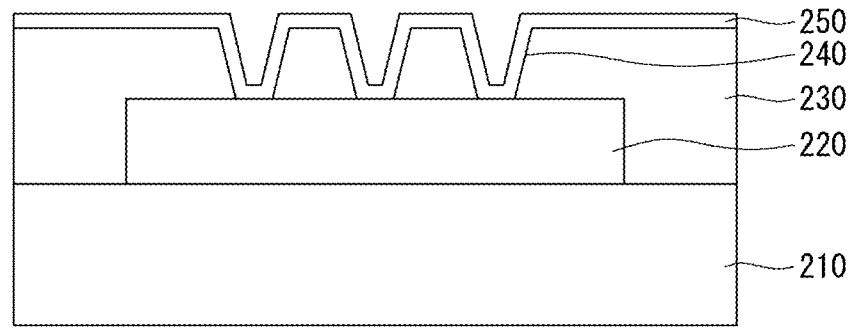

Next, referring to FIG. 12B, titanium (Ti), tungsten (W), palladium (Pd), or alloys thereof are deposited on the substrate 210 with the plurality of open portions 240 formed thereon through sputtering to form a first metal layer 250. The first metal layer 250 is formed on the surface of the insulating layer 230, the pad 220, and the open portions 240. The first metal layer 250 is formed to have a thickness ranging from 1 to 1000 nm.

Figure 12C:
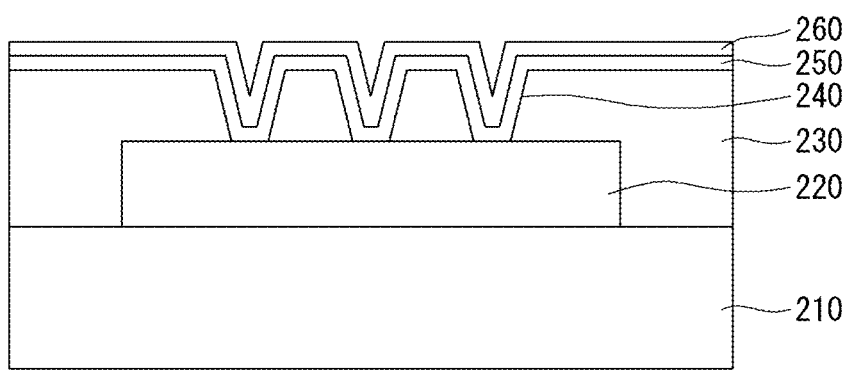

Thereafter, referring to FIG. 12C, a low resistive metal, e.g., gold (Au), is deposited on the substrate 210 with the first metal 250 formed thereon through sputtering to form a second metal layer 260. The second metal layer 260 is formed on the first metal layer and has a thickness ranging from 1 to 1000 nm.

Figure 12D:
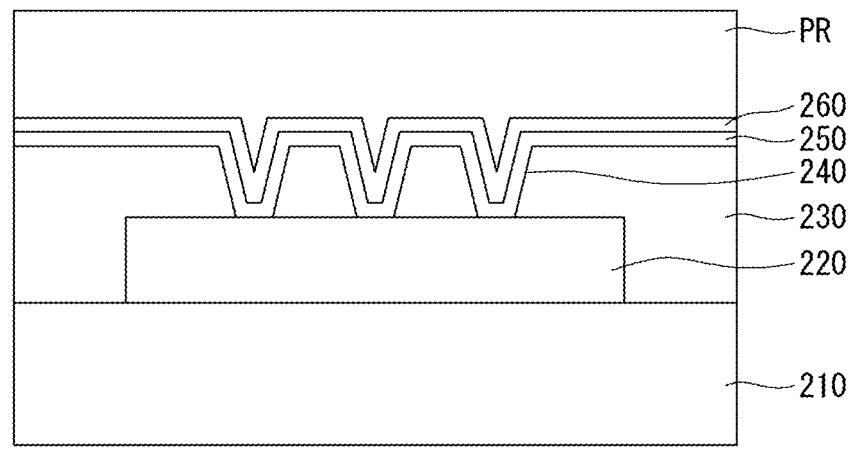
Figure 12E:
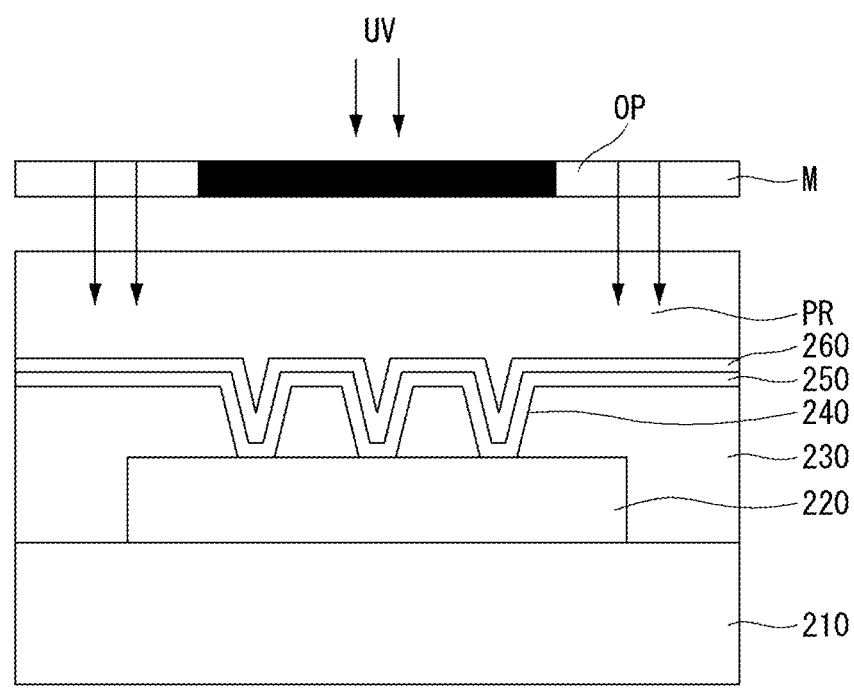
Figure 12F:
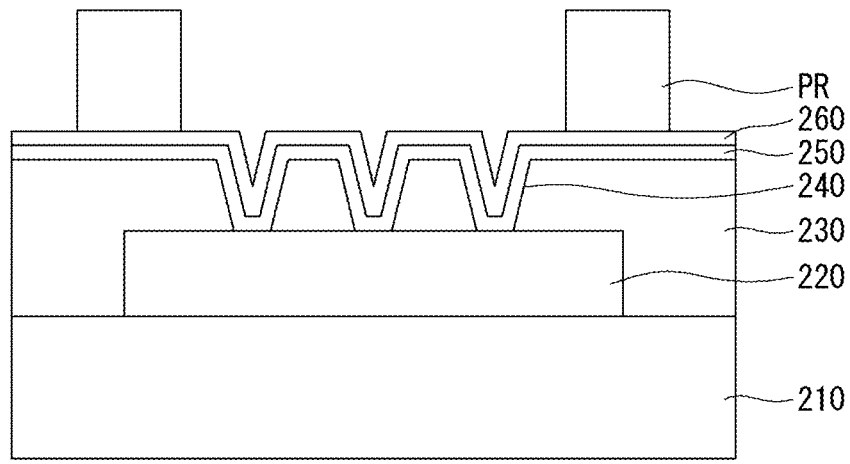

Thereafter, referring to FIGS. 12D and 12E, photoresist is coated on the substrate 210 with the second metal 260 formed thereon. A mask (M) including an opening OP is aligned on the substrate 210 and ultraviolet ray (UV) is irradiated thereto to expose and develop the photoresist (PR). Thus, the photoresist (PR) is patterned such that the open portions 240 of the insulating layer 230 are exposed as illustrated in FIG. 12F.

Figure 12G:
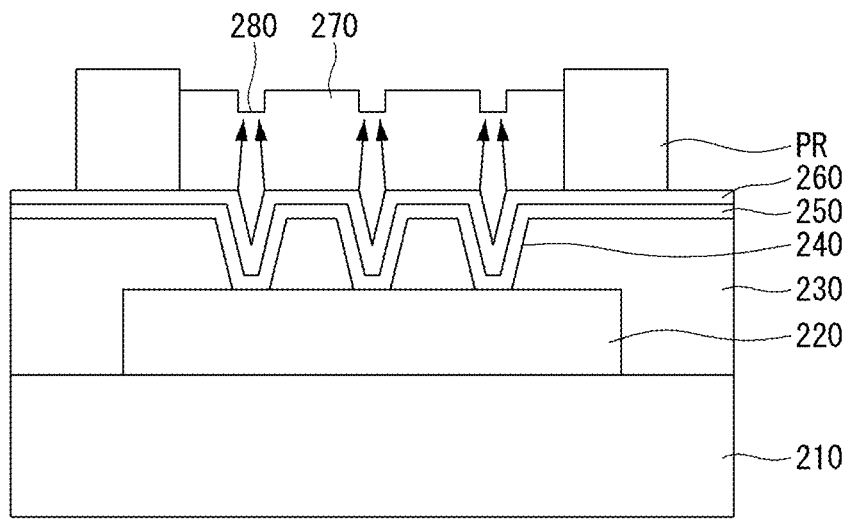
Figure 12H:
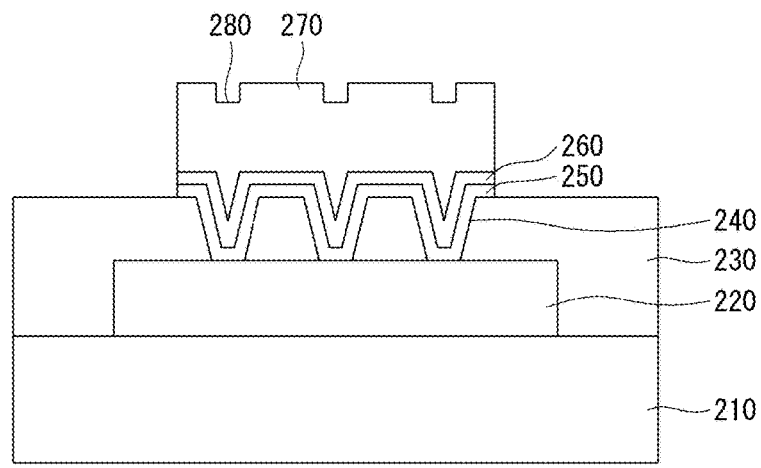

Thereafter, referring to FIG. 12G, a bump electrode 270 is formed on the second metal layer 260 using electroplating on the substrate 210 with the photoresist (PR) formed thereon. Subsequently, as illustrated in FIG. 12H, the photoresist (PR) is stripped to be removed, and the first metal layer 250 and the second metal layer 260 are patterned using the bump electrode 270 as a mask, thus manufacturing bumps of the array substrate for a display device according to an embodiment of the present invention.

Figure 13:
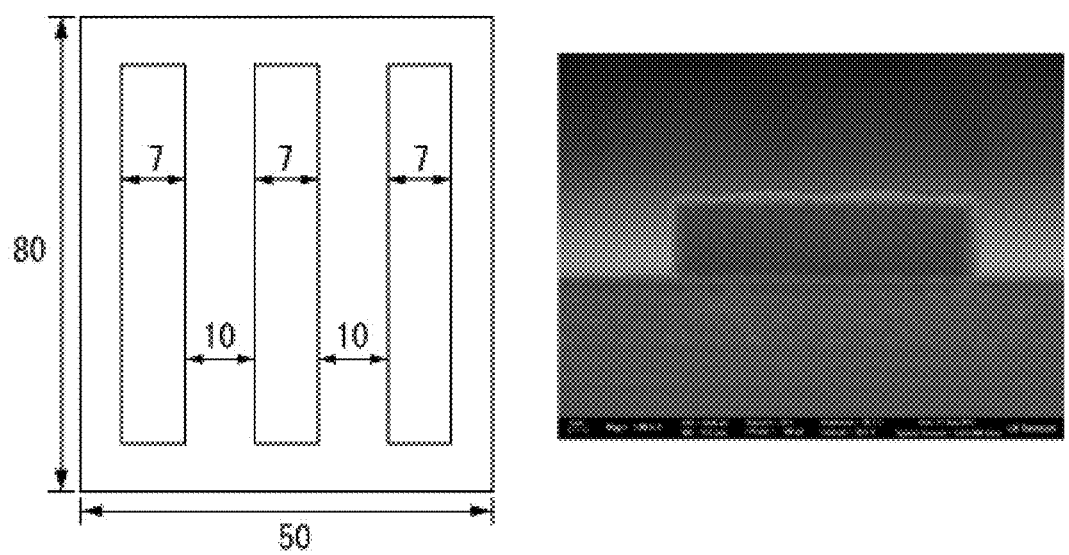
FIGS. 13 and 14 are images of bumps according to sizes of an insulating layer and an open portion of an array substrate for a display device according to an embodiment of the present invention.
Figure 14:
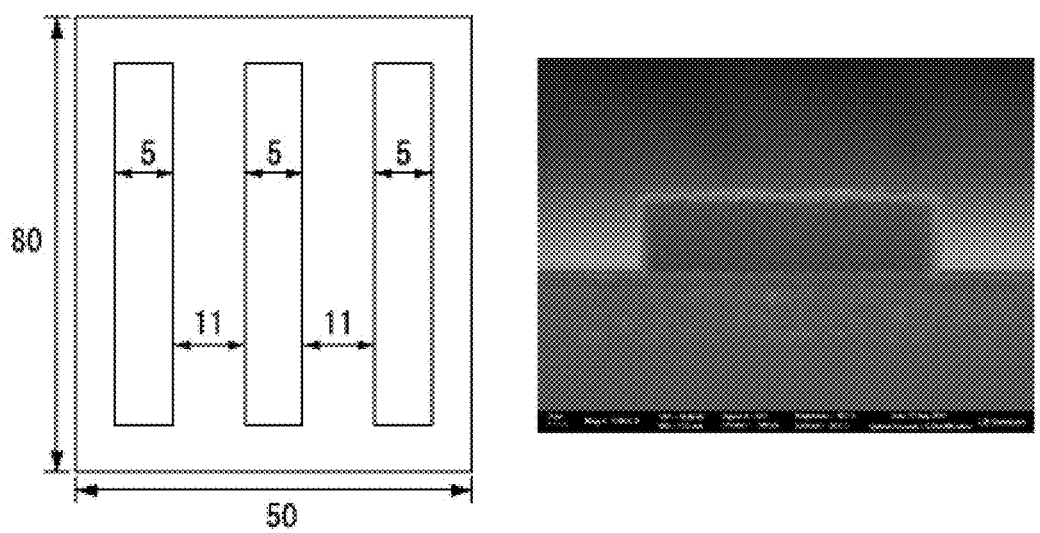
Figure 15:
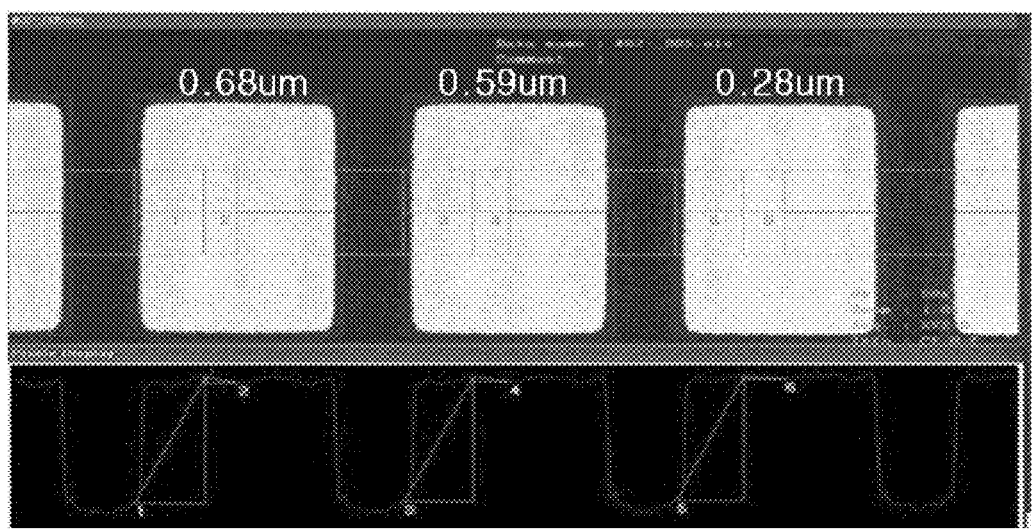
FIG. 15 is an image illustrating measured heights of the lowermost point and uppermost point of a plurality of bumps.

FIGS. 13 and 14 are images of bumps according to sizes of an insulating layer and an open portion of an array substrate for a display device according to an embodiment of the present invention, and FIG. 15 is an image illustrating measured heights of the lowermost point and uppermost point of a plurality of bumps.

Referring to FIG. 13, a bonding area of an insulating layer is formed to be 50 μm in width and 80 μm in length, and three open portions 7 μm in width and 50 μm in length are formed at 10 μm in pitch therebetween. Thereafter, a bump electrode is formed on the insulating layer and the result showed that a surface of the bump electrode was flat (even). Also, referring to FIG. 14, a bonding area of an insulating layer is formed to be 50 μm in width and 80 μm in length, and three open portions 5 μm in width and 50 μm in length are formed at 11 μm in pitch therebetween. Thereafter, a bump electrode is formed on the insulating layer and the result showed that a surface of the bump electrode was flat (even).

Referring to FIG. 15, a plurality of bumps designed to have the specifications illustrated in FIG. 13 are formed on an array substrate for a display device. Height differences between the lowermost points and uppermost points of the bumps are 0.68 μm, 0.59 μm, and 0.28 μm, all of which are within a dimple specification of 1.0 μm or less.

Through the results of the foregoing experiment, in the bump according to an embodiment of the present invention, since a plurality of open portions are provided in the insulating layer, a dimple of the bump electrode is reduced and bonding reliability with respect to a driving chip is enhanced, improving a display defect.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a display device, the array substrate comprising:
a substrate;
a pad positioned on the substrate;
an insulating layer positioned on the pad and including a plurality of contact holes exposing the pad;
a first metal layer positioned on the insulating layer and disposed on the plurality of contact holes to be in contact with the pad;
a second metal layer positioned on the first metal layer; and
a bump electrode positioned on the second metal layer and including a plurality of dimples,
wherein the bump electrode is electrically connected to the pad through the plurality of contact holes filled with the first and second metal layers.

2. The array substrate of claim 1, wherein at least one of the plurality of contact holes has a width equal to or greater than 5 μm and a length equal to or greater than 10 μm.

3. The array substrate of claim 2, wherein a pitch between the plurality of contact holes is equal to or greater than 4 μm.

4. The array substrate of claim 1, wherein a bonding area in which the insulating layer and the bump electrode are in contact is equal to or greater than 1500 μm 2, and an area of the plurality of contact holes is equal to or greater than 15% of the bonding area.

5. The array substrate of claim 1, wherein the plurality of contact holes are formed as a plurality of line-shaped open portions or a plurality of dot-shaped open portions.

6. A display device, comprising:
a substrate including a display area for displaying an image and a non-display area; and
a chip on glass (COG) unit positioned in the non-display area and including a plurality of bumps,
wherein each of the plurality of bumps includes:
a pad positioned on the substrate;
an insulating layer positioned on the pad and including a plurality of contact holes exposing the pad;
a first metal layer positioned on the insulating layer and disposed on the plurality of contact holes to be in contact with the pad;
a second metal layer positioned on the first metal layer; and
a bump electrode positioned on the second metal layer and including a plurality of dimples,
wherein the bump electrode is electrically connected to the pad through the plurality of contact holes filled with the first and second metal layers.

7. The display device of claim 6, wherein at least one of the plurality of contact holes has a width equal to or greater than 5 μm and a length equal to or greater than 10 μm.

8. The display device of claim 7, wherein a pitch between the plurality of contact holes is equal to or greater than 4 μm.

9. The display device of claim 7, wherein a bonding area in which the insulating layer and the bump electrode are in contact is equal to or greater than 1500 μm 2, and an area of the plurality of contact holes is equal to or greater than 15% of the bonding area.

10. The display device of claim 6, wherein the plurality of contact holes are formed as a plurality of line-shaped open portions or a plurality of dot-shaped open portions.

* * * * *